United States Patent [19]

Bench

[11] 4,229,822
[45] Oct. 21, 1980

[54] DATA DETECTOR FOR A DATA COMMUNICATION SYSTEM

[75] Inventor: Stephen M. Bench, Huntington Beach, Calif.

[73] Assignee: Motorola, Inc., Schaumburg, Ill.

[21] Appl. No.: 7,086

[22] Filed: Jan. 29, 1979

Related U.S. Application Data

[62] Division of Ser. No. 830531, Sep. 6, 1977, Pat. No. 4,156,867.

[51] Int. Cl.³ .................. H03D 3/18; H04L 27/14
[52] U.S. Cl. ........................... 375/81; 375/90; 375/120; 329/122
[58] Field of Search ............... 325/418–423, 325/60, 17, 25, 19, 20, 320; 178/66 R, 88; 329/50, 122, 123, 124; 340/146.1 D, 170, 171 R; 375/81, 90, 97, 119, 120

[56] References Cited

U.S. PATENT DOCUMENTS

| | | | |
|---|---|---|---|
| 3,289,082 | 11/1966 | Shumate | 178/66 R |
| 4,035,727 | 7/1977 | Ishii | 325/184 X |

Primary Examiner—Benedict V. Safourek
Attorney, Agent, or Firm—Rolland R. Hackbart; James W. Gillman

[57] ABSTRACT

A data communication system for use in the control and monitoring of mobile stations, for example, in a bus monitoring system, from a central station over a communication channel carrying both data and voice information. Information is encoded into digital messages having a start code followed by one or more data blocks. The start code identifies the beginning of the data block that follows and enables synchronization of clock circuitry to the received data frequency. The data blocks have N digital words with M binary bits where one word is a parity word and N-1 words are data words. Each of the data words has a data portion and parity portion coded for correction of at least one error. Reliability is enhanced by a data detector which discriminates between data and noise or voice to provide an indication of the presence of data. In transmitting the digital messages, the bits of the N words in each data block are interleaved to provide protection against error bursts.

11 Claims, 12 Drawing Figures

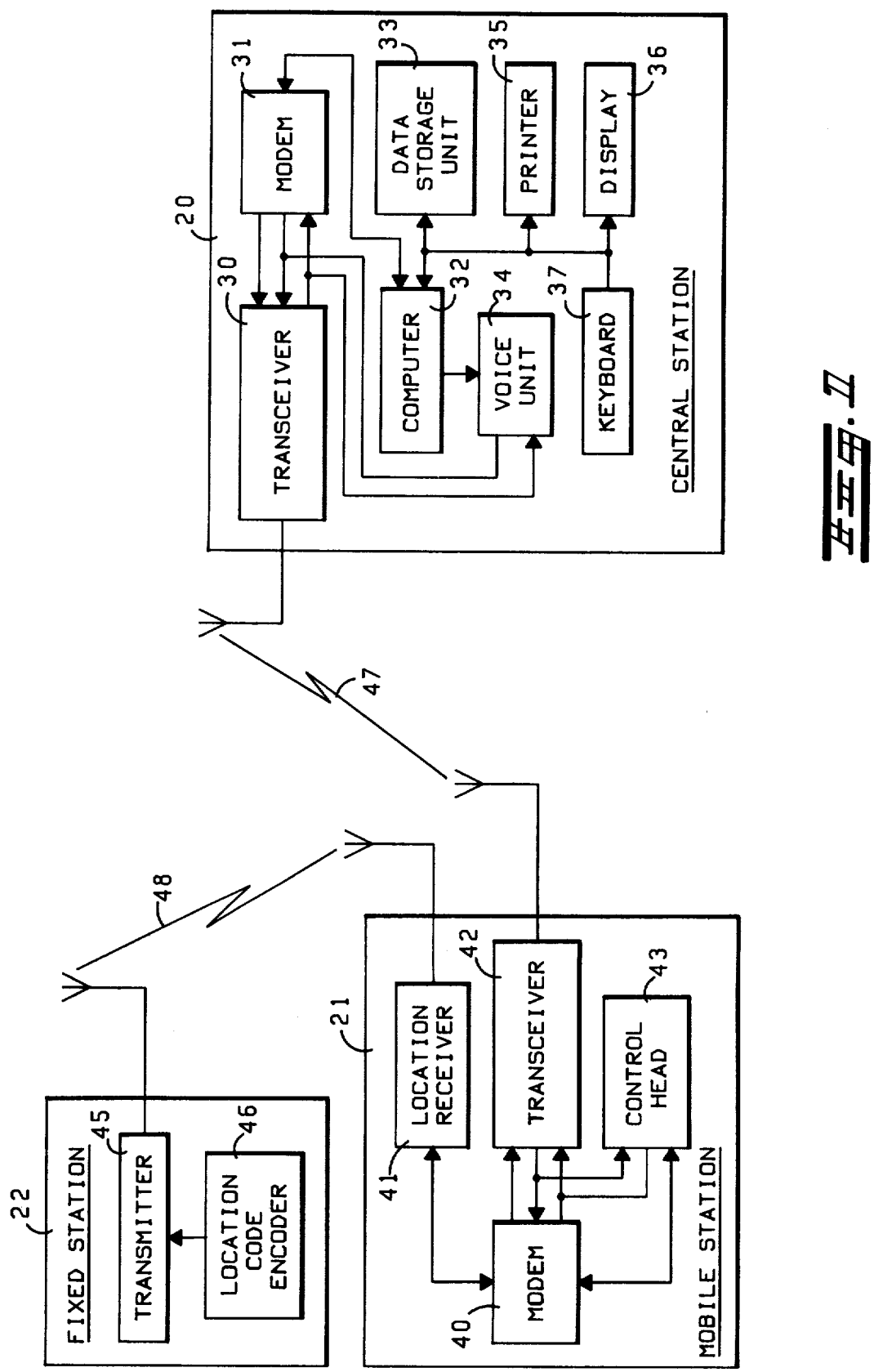

| D1 | D2 | D3 | D4 | P1 | P2 | P3 |
|----|----|----|----|----|----|----|
| D5 | D6 | D7 | D8 | P4 | P5 | P6 |
| D9 | D10 | D11 | D12 | P7 | P8 | P9 |
| D13 | D14 | D15 | D16 | P10 | P11 | P12 |
| D17 | D18 | D19 | D20 | P13 | P14 | P15 |
| D21 | D22 | D23 | D24 | P16 | P17 | P18 |
| VP1 | VP2 | VP3 | VP4 | VP5 | VP6 | VP7 |
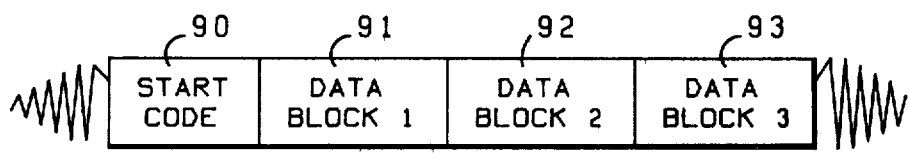
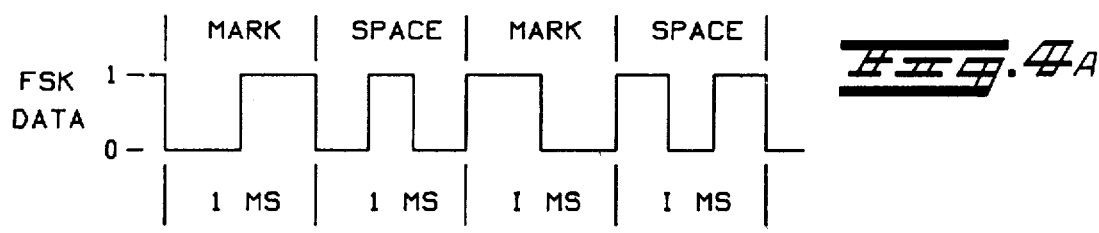
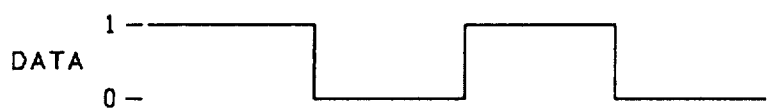

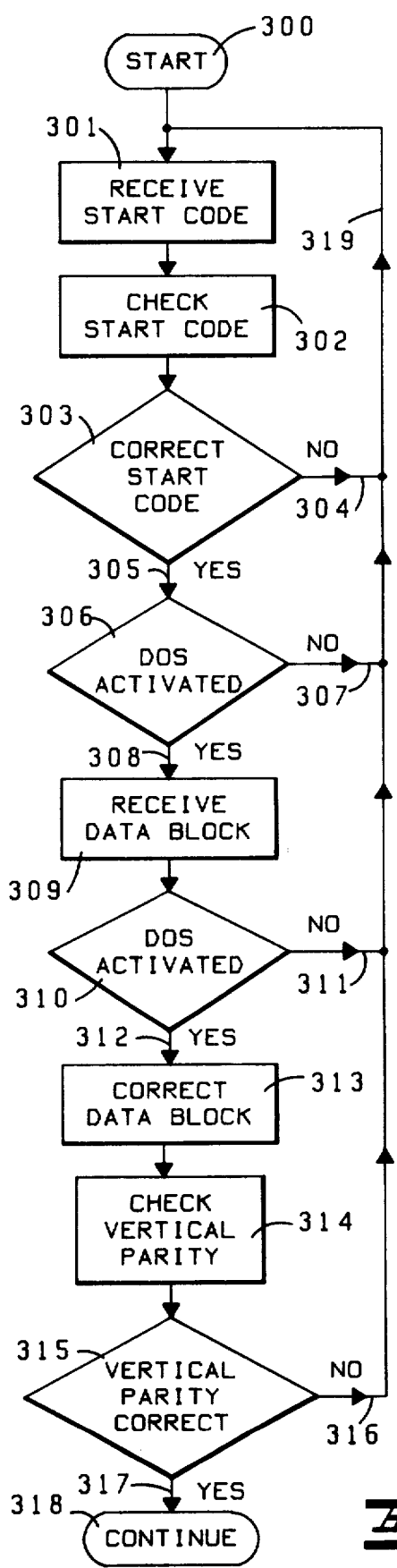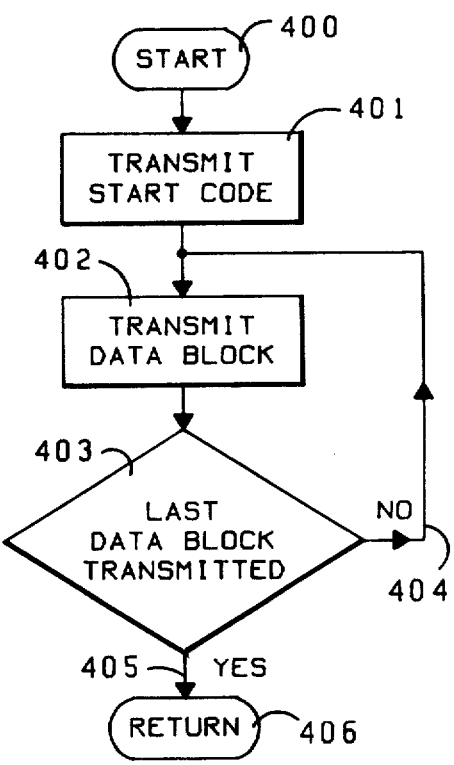

4,229,822

DATA DETECTOR FOR A DATA COMMUNICATION SYSTEM

This is a division of application Ser. No. 830,531, filed Sept. 6, 1977, which has matured into U.S. Pat. No. 4,156,867.

BACKGROUND OF THE INVENTION

1. Field of the Invention

This invention relates to a data communication system, and, more particularly, to an improved method and apparatus for a data communication system utilizing a coded digital signalling system.

2. Description of the Prior Art

In order to expand the capacity of a communication system, one may add more communication channels to the system or increase the amount of information carried on each of the existing communication channels. Since the number of communication channels is limited for most systems, it has been more practical to increase the amount of information carried on each communication channel by various methods, for example, multiplexing and digital techniques. The communication systems using these concentrating techniques must be reliable to insure that the information is not lost. The reliability of communication systems using digital messages may be enhanced by using such techniques as error correcting codes and multiple transmissions of the digital messages. However, prior art communication systems, such as radio communication systems, are still prone to burst errors and have yet to realize optimal usage of error correcting and detecting techniques in a bandwith limited system. This is especially the case with radio communication systems where interference and fading must be accommodated.

For the foregoing and other shortcomings and problems, there has been a long felt need for an improved data communication system.

SUMMARY OF THE INVENTION

Accordingly, it is a general object of the present invention to provide an improved data communication system.

It a further object of the present invention to provide a more reliable data communication system.

It is still a further object of the present invention to provide an improved data communication system that provides random and burst error protection and correction.

It is yet a further object of the present invention to provide an improved data communication system that can recognize the presence of noise or voice to provide additional protection against the reception of invalid digital messages.

In accordance with the present invention, the aforementioned problems and shortcomings of the prior art are overcome and the stated and other objects are attained by an improved digital data communication system that includes a central station and a plurality of mobile stations. The system may further include one or more fixed stations for providing relevant information, such as geographical location information, to the mobile stations. Communication channels of the system may carry voice between the operator of the mobile station and the dispatcher at the central station without affecting the reliability of the digital message transmissions.

According to an important feature of the present invention, a detector of a coded digital message is provided that can discriminate data from noise, voice, or music. The data detector includes means for decoding the digital message; means for recovering the bit frequency of the digital message; means for multiplying the digital message and the bit frequency and providing a multiplied output signal; a bandpass filter for passing a band of frequencies between a predetermined lower and upper frequency; and output means for providing an indication of the presence of the digital message when the magnitude of the output signal from the bandpass filter is less than a predetermined magnitude. The data detector can be operated simultaneously with the reception of data, and if valid data is not indicated by the data detector, the received data is discarded. Thus, the reliability of the data communication system of the present invention is enhanced by the data detector.

Additional features, objects, and advantages of the data communication system in accordance with the present invention will be more clearly apprehended from the following detailed description together with the accompanying drawings.

BRIEF DESCRIPTION OF THE DRAWINGS

FIG. 1 illustrates a data communication system in accordance with the present invention.

FIG. 2 illustrates a typical transmission of data having a start code followed by three data blocks.

FIG. 3 illustrates a 7×7 digital data block which has 24 data bits, numbered D1 through D24; 18 parity bits, numbered P1 through P18; and 7 vertical parity bits, numbered VP1 through VP7.

FIGS. 4A and 4B illustrate partial waveforms of a digital message where a frequency-shift keying (FSK) waveform is shown in FIG. 4A and the corresponding data waveform is shown in FIG. 4B.

FIG. 9 illustrates logical state assignments which may be utilized for the parity portion of the digital messages.

FIG. 10 illustrates a flow chart of a subprogram of the stored program in the modem of FIG. 5 for receiving digital messages.

FIG. 11 illustrates a flow chart of a subprogram of the stored program in the modem of FIG. 5 for transmitting digital messages.

DESCRIPTION OF THE PREFERRED EMBODIMENT

Figure 5:
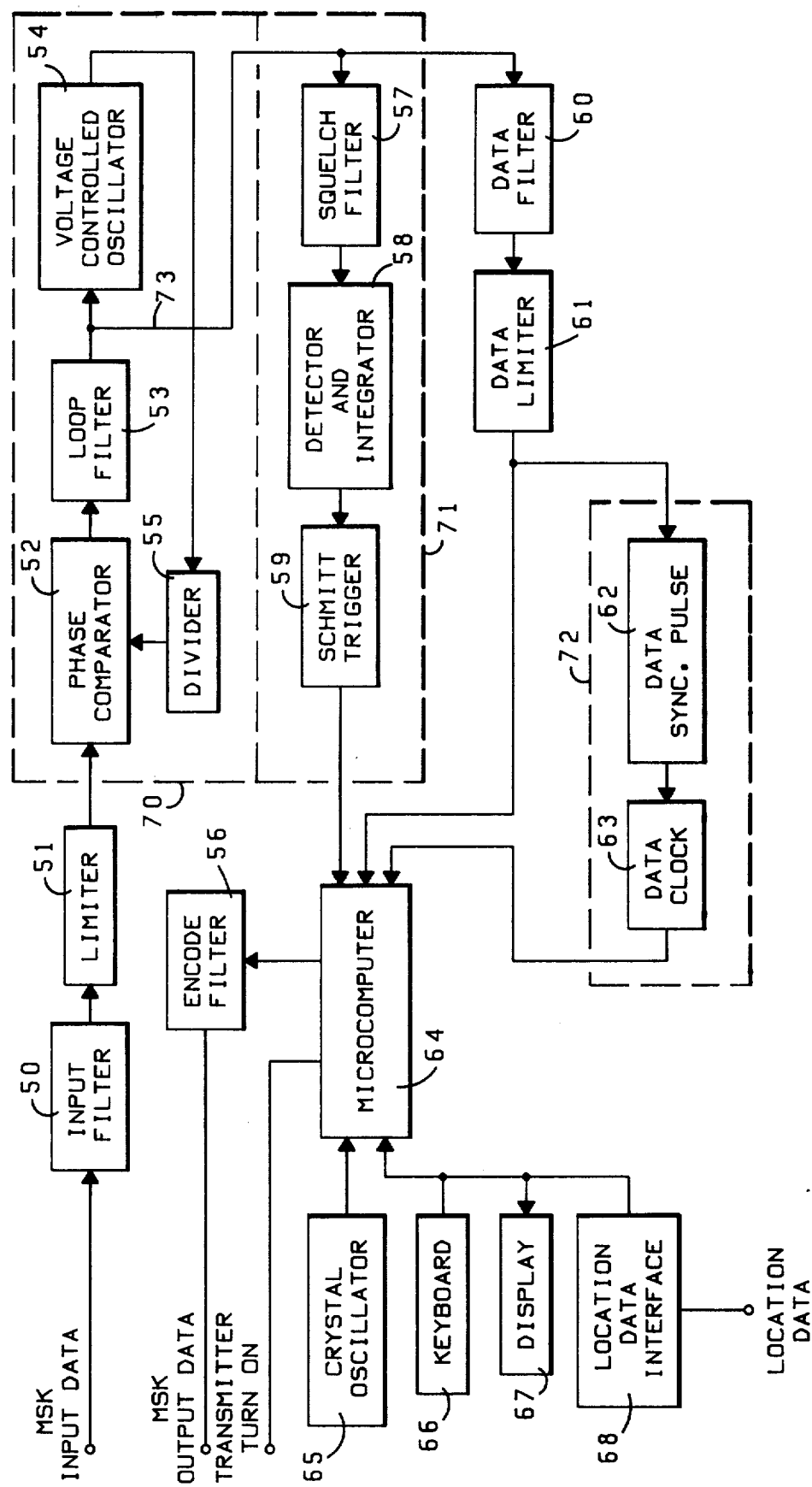
FIG. 5 illustrates a block diagram of a modem for the data communication system of the present invention.

Referring to FIG. 1, a data communication system embodying the present invention is illustrated where information is communicated by digital messages between a central station 20, a mobile station 21 and a fixed station 22 over radio channels. The exemplary embodiment is a computer-controlled vehicle monitoring system which is described in U.S. Pat. No. 3,644,883, entitled "Automatic Vehicle Monitoring, Identification, Location, Alarm and Voice Communication System", by W. M. Borman et al. In this system, the central station 20 is a command and control station that is operated by a dispatcher, the mobile station 21 is a bus and the fixed station 22 is a signpost having a predetermined location code. The bus stores the signpost location code when it passes in close proximity to the particular signpost, and relays that information to the command and control station for providing the dispatcher with the approximate location of the bus along its route of travel. The bus also communicates alarm, status and additional information to the command and control station over the communication channel. Voice communications may also take place between the driver of the bus and the dispatcher. Information is communicated between the bus and the command and control station by digital messages, as will be explained hereinafter. Details of the vehicle location system are also described in the Motorola, Inc. instruction manual entitled, "METROCOM Transit Data System and Location System," published by Motorola Service Publications, 1976, Schaumburg, Illinois.

The above referenced vehicle monitoring system communicates digital messages between the central station 20, the mobile station 21, and the fixed station 22 which are coded according to audio frequency- shift keying (AFSK) at a frequency of 500 bits per second (500 baud). The information in the digital message is repeated twice and the repetitions are compared at the receiving station for error detection purposes. However, no error correction or burst error protection is provided.

In FIG. 1, the central station 20 is made up of a radio transceiver 30, a modem 31, a voice unit 34, and a computer, or microcomputer 32 and its associated peripherals, data storage unit 33, printer 35, display 36 and keyboard 37. A dispatcher enters information by way of the keyboard 37. The entered information is converted to a digital message by the computer 32, coded by the modem 31 and transmitted over a radio channel 47 to the mobile station 21 by the transceiver 30. Both transmitted and received digital messages are visually displayed to the dispatcher in the display 36, which may be any of a number of displays including alphabetic, graphical, or digital displays.

The mobile station 21 includes a modem 40, a transceiver 42, a location receiver 41 and a control head 43. An operator of the mobile station 21 can talk to the dispatcher by means of the control head 43. Digital messages are coded by the modem 40 and transmitted over the radio channel 47 by the transceiver 42 both automatically and in response to operator directives entered into the control head 43. The location receiver 41 receives a predetermined location code from a fixed station 21 over radio channel 48, which is coded by the modem 40 for transmission to the central station 20.

The fixed station 22 includes a radio transmitter 45 and a location-code encoder 46. Fixed stations 22 are located along the route of the mobile station 21 and are each uniquely assigned a predetermined location code for identifying the particular fixed station 22. The fixed station 22 continuously transmits its predetermined location code on a location radio channel 48 which is different from the data radio channel 47. When a mobile station 21 comes in close proximity to the fixed station 22, it receives the predetermined location code from the particular fixed station 22 and relays it to the central station 20 automatically. Thus, the position of the mobile station 21 along its route of travel can be determined by the central station 20.

The improved data communication system of the present invention utilizes a signalling system which enhances the reliability of the aforementioned vehicle monitoring system and other prior art systems. Referring to FIG. 2, the digital message is preceded by a start code 90 after which one or more data blocks 91, 92 and 93 are transmitted. The start code is preferably a correlatable pattern of binary bits that defines the beginning of the first data block 91 and enables synchronization to the data frequency. Start codes 90 having these characteristics are described in a copending application, Ser. No. 830,951, entitled "Method and Apparatus for the Synchronization of Data Bit Streams," by John En, filed on Sept. 6, 1977 and assigned to same assignee as the present application. The start code selected from the above referenced application for use in the data communication system of the present invention is the 32 bit code with the following bit sequence:

00001010101011010010100110011011.

The particular data rate utilized in the data communication system of the present invention may be any practical frequency selected to meet the system requirements and specifications.

The data blocks 91, 92 and 93 are organized into a 7×7 block of binary bits, although any practical number of words and binary bits can be utilized to practice the present invention. In FIG. 3, the 7×7 data block 80 contains 24 data bits, numbered D1 through D24; 18 parity bits numbered P1 through P18; and 7 parity bits hereinafter designated vertical parity bits, numbered VP1 through VP7.

A digital word is a horizontal group of bits, for example, D1 through D4 and P1 through P3 being the first digital word. Thus, each word consists of a four-bit data portion and a three-bit parity portion. The parity portion is encoded according to a Hamming code for correcting one error in the corresponding data portion of the digital word. The particular parity bits associated with the data portions of the digital words are listed in FIG. 9, where each digital word is at least a Hamming distance of three from the other digital words.

The parity bits of the digital words are selected to satisfy the matrix equation HT=0, where H is a rectangular 3×7 matrix and T is a 1×7 column matrix made up of a digital word from the data block, for example the first digital word of the data block 80 in FIG. 3 would be D1, D2, D3, D4, P1, P2, P3. For the H matrix shown below, the following equations result for the first digital word where the + sign indicates modulo 2 addition.

$$\text{For } H = \begin{vmatrix} 0001111 \\ 0110011 \\ 1010101 \end{vmatrix} \text{ and } T = \begin{vmatrix} D1 \\ D2 \\ D3 \\ D4 \\ P1 \\ P2 \\ P3 \end{vmatrix}$$

$$\text{then } HT = 0 = \begin{bmatrix} D4 + P1 + P2 + P3 \\ D2 + D3 + P2 + P3 \\ D1 + D3 + P1 + P3 \end{bmatrix}$$

If HT≠0, then a single bit error is assumed to be present and an error correction algorithm may be performed to correct the erroneous bit.

The matrix organization of the data words is readily adapted to processing by a computer or microcomputer. In the data communication system of the present invention, the receiving and transmitting of the digital messages is performed by a microcomputer having a stored program, utilizing the algorithms depicted in the flow charts of FIGS. 10 and 11.

The bits of the vertical parity word, which are VP1-VP7 (see FIG. 3), are each derived from the group of six bits in its respective column, for example, VP1 is derived from D1, D5, D9, D13, D17 and D21. The vertical parity bits are derived according to a predetermined format such that none of the columns of bits contain all zeros or all ones. For instance, the vertical parity bit can be selected to be a logical one when all other bits in its respective column are logical zeros, and for all other conditions the vertical parity bit is a logical zero. By selecting the vertical parity bits in this manner, the low frequency content of the transmitted data block is reduced, which allows a corresponding reduction in the bandwidth of the modem which decreases low frequency noise interference. In addition, the vertical parity bits enable the detection of a double error in at least one of the digital words. The vertical parity bits obtained in the aforementioned manner forms a parity word for the system.

The digital message, transmitted over the communication channel as shown in FIG. 2, is interleaved during transmission to provide burst error protection. Interleaving of the digital message is accomplished by transmitting the columns of binary bits (see FIG. 3) sequentially, instead of transmitting one entire digital word after another. For example, the data block 80 of FIG. 3 would be transmitted in the following sequence; D1, D5, D9, D13, D17, D21, VP1, D2, D6, etc. Interleaving the bits of the digital message results in a maximum fade margin of 7 consecutive erroneous bits. If 7 consecutive bits are in error, then each data word has at most one bit in error which is correctable by use of the Hamming code.

The digital messages are transmitted over the communication channel by means of coherent audio frequency-shift keying. Coherent operation is characterized by transmission of audio tones which are rationally related to each other, with transmission of each bit initiated at a constant and defined phase relationship. Further, the digital messages are transmitted by means of minimum shift keying (MSK). Minimum shift keying operation is characterized by the audio tone for the logical one state being equal to the data frequency and the audio tone representing the logical zero state being equal to 1½ times the data frequency. Each data bit starts and ends on a zero crossing of the respective tones. In the preferred embodiment, the tones selected are 1000 Hz for a mark and 1500 Hz for a space. A mark corresponds to a data bit having a logical one state and a space corresponds to a data bit having a logical zero state. Referring to FIGS. 4a and 4b, a portion of a digital message is shown where FIG. 4a and is a waveform of the MSK data and FIG. 4b, is a waveform of the demodulated data.

By using MSK with tones of 1000 Hz and 1500 Hz, the spectral energy is contained substantially within the band of frequencies from 800 Hz to 1700 Hz. Such a bandwith is compatible with data communications systems operating over radio communication channels or telephone wire lines. In the preferred embodiment, the frequency of the data which is referred to as 1000 baud, in actuality, is 1075.28 baud which was selected as close as possible to 1000 baud while still being compatible with the frequency of operation of the microcomputer in the modem.

Referring to FIG. 5, a block diagram illustrates more clearly an embodiment of a modem for the data communication system of the present invention. The MSK input data is first connected to the input filter shown 50. The purpose of this filter is to provide some pre-filtering action to limit the input bandwith to only that occupied by the MSK input data and to reject noise falling outside this band. For example, it may be comprised of four poles of high frequency at 1800 Hz and two poles of low frequency roll off, thereby providing an input filter which is generally a bandpass filter occupying the band 800 Hz to 1700 Hz. The output of the input filter 50 is then amplified and limited by the limiter 51. The purpose of the limiter 51 is to provide a square wave signal to the phase comparator 52 of the phase locked loop 70. Therefore, the MSK input data is translated into zero-crossing information by the limiter 51, which is then processed by the phase locked loop 70.

The phase locked loop 70 includes a phase comparator 52, a loop filter 53, a voltage controlled oscillator (VCO) 54 and a divider 55. The phase comparator 52 compares the incoming phase of the limited MSK input data to that of the VCO 54 through the divider 55. It then provides an output voltage to the loop filter 53 indicating that the frequency of the VCO 54 is either too high or too low for correcting the frequency of the voltage control oscillator.

The loop filter 53 is tailored to reject noise which may be introduced by either the phase locked loop 70 itself or the MSK input data through a noisy signal. The bandwidth of the loop filter 53 is therefore controlled to be only that necessary for the data, which is approximately 500 Hz for MSK input data at 1000 baud. The loop filter 53 not only limits the bandwidth in the phase locked loop 70, but also maintains the stability of the phase locked loop 70. The error voltage 73 from the loop filter 53 is then fed into the VCO 54. The output of the VCO 54 is approximately sixteen times the frequency of the MSK input data and is fed into a divider 55 for dividing the VCO output by sixteen. Operating the VCO 54 at sixteen times the frequency of the MSK input data provides better protection against noise and allows improved operation of the phase locked loop 70.

The error voltage 73 from the loop filter 53 contains the recovered data together with high frequency components. The error voltage 73 is coupled to the data-operated-squelch circuitry 71 and the data filter 60. The data filter 60 is a low pass filter for removing the input data from the error voltage 73, where the data is contained substantially within the frequency band from 0 Hz to 500 Hz. The data filter 60 is optimized to closely match the characteristics of input data carried on the error voltage 73.

The data limiter 61 then provides mark and space (see FIGS. 4A and 4B) information by a conventional bit slicing process. If the input data is more generally of mark frequency, the output of the data limiter 61 is a logical one. If the input data is generally more of a space frequency, the output of the data limiter 61 is a logical zero. The output of the data limiter 61 is the recovered input data which is coupled to the data clock circuitry 72 and the microcomputer 64. The data clock circuitry 72 utilizes the transitions of the recovered input data from the data limiter 61 for synchronizing to the input data frequency. The data sync pulse 62 provides a sync pulse for each transition of the recovered input data.

Figure 8:
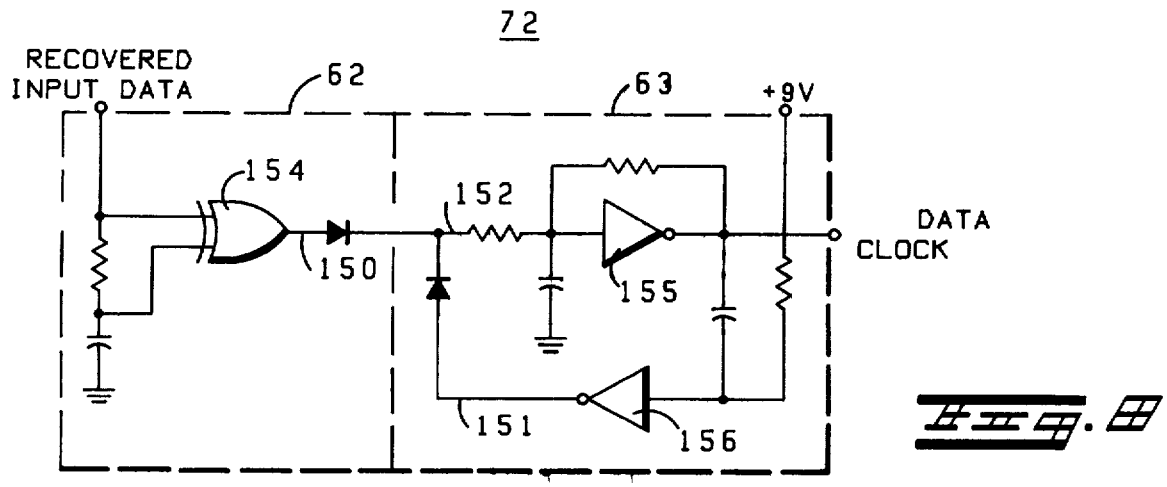
FIG. 8 illustrates an embodiment of the data clock circuitry for the modem of FIG. 5.

The sync pulses are applied to the data clock 63 for phase synchronizing the data clock 63 to the data frequency. In the absence of sync pulses, the data clock 63 free runs at the data frequency, 1000 baud in the exemplary embodiment. The output of the data clock 63 is approximately a 1000 Hz square wave with fifty percent duty cycle and is applied to the microcomputer 64. An exemplary embodiment of the blocks 62 and 63 of the data clock circuitry 72 is illustrated in detail in FIG. 8.

The data-operated-squelch (DOS) circuitry 71 includes a squelch filter 57, a detector and integrator 58 and a Schmitt trigger 59. The output of the Schmitt trigger is a logical zero when data has been detected and is applied to the microcomputer 64. The data-operated-squelch circuitry 71, accurately discriminates data from noise, voice, or music. An exemplary embodiment of the blocks 57, 58 and 59 of the DOS circuitry 71 is illustrated in detail in FIG. 7.

A computer system, which controls the generation of the modem, includes a microcomputer 64, a crystal oscillator 65, a keyboard 66, a display 67, and a location data interface 68. The computer system can utilize any of a number of commercially available microcomputers or computers, for example, the Motorola MC6801 or the combination of the MC6802 and MC6846. The crystal oscillator 65 provides the operating frequency for the microcomputer 64. The microcomputer 64 receives operator information from the keyboard 66 and location data from the location data interface 68 and provides information to an operator in the display 67. The keyboard 66, display 67 and location data interface 68 (see aforementioned U.S. Pat. No. 3,644,883) are interconnected with the microcomputer 64 via address and data bus lines in a conventional manner. Furthermore, all interface connections to the microcomputer 64 can be readily accomplished by one skilled in the art by conventional techniques. For example, where the microcomputer 64 is the MC6801, one may refer to the published specification for the MC6801 to determine specific interconnections to the MC6801 ports. When using an MC6801, the keyboard 66, display 67 and location data interface 68 may be connected to parallel address and data ports, while the encode filter 56, DOS circuitry 71, data limiter 61 and clock circuitry 72 may be connected to single-line input/output ports.

For receiving digital messages, the microcomputer 64 assembles and de-interleaves the recovered input data from the data limiter 61 as defined by the recovered data frequency from the data clock 63. If an indication that data is present is not received from the data-operated-squelch circuitry 71, the received digital message will be ignored. Also, if the recovered input data has more than one error in at least one word, the received digital message is invalid.

For transmission of information the microcomputer 64 arranges the information into a digital message having a start code followed by requisite data blocks and applies the digital message in MSK format to the encode filter 56. The encode filter 56 takes the digital waveform from the microcomputer 64 and provides the sinusoidal MSK output data for transmission on the communication channel.

Figure 6:
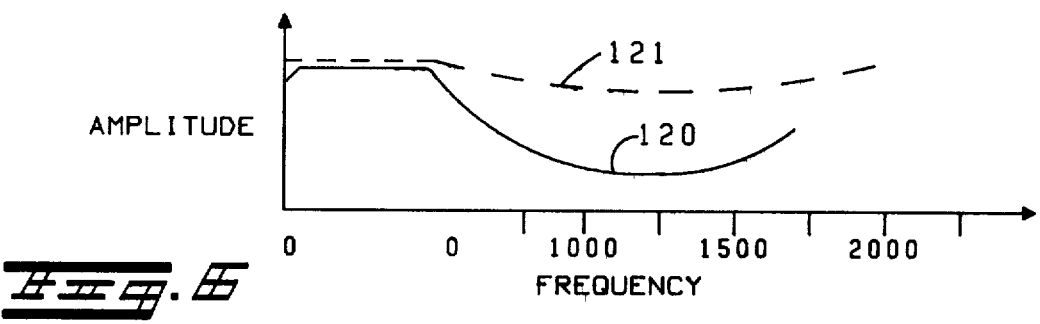
FIG. 6 illustrates a graph of the error voltage resulting from data and noise inputs to the phase locked loop for the modem of FIG. 5.
Figure 7:
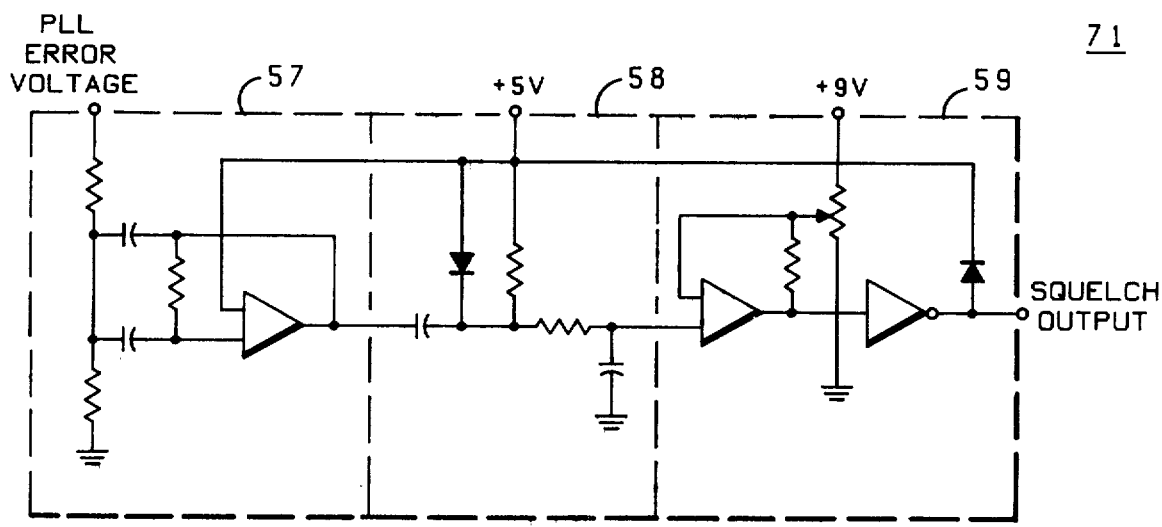
FIG. 7 illustrates an embodiment of the data-operated-squelch circuitry for the modem of FIG. 5.

The data operated squelch (DOS) circuitry 71 of FIG. 5 is illustrated more clearly in the embodiment shown in FIG. 7. The DOS circuitry utilizes the error voltage of a phase locked loop for discriminating data from noise, voice, or music. When noise is present, the error voltage is greater and has an essentially flat frequency response characteristic 121, as shown by the dotted line in FIG. 6. However, when data is present and the phase locked loop is locked, the frequency characteristic 120 of the error voltage will have components below 500 cycles a substantially dead band from 500 Hz to approximately 1700 Hz and noise and harmonics above 2000 Hz. The components of the error voltage above 2000 Hz are caused by the maintenance capability within the phase locked loop itself. But, there is a dead band centered generally around 1000 Hz only when data is present and under no other conditions. This dead band then can be used to provide an indication of data. As the strength of the MSK input data gets lower and lower, the data frequency characteristic 120 gradually approaches the noise frequency characteristic 121. The foregoing is also true of voice signals, music, inter-modulation distortion or other interfering signals. Thus, the DOS circuitry can determine the difference between data and anything else from the frequency characteristic 120 of the error voltage in the vicinity of 1000 Hz. In the preferred embodiment of the system, the DOS circuitry 71 can be essentially 100 percent effective in differentiating between noise and data and is greater than 99 percent effective in distinguishing between voice and data.

Referring to FIG. 7, the DOS circuitry 71 includes a squelch filter 57, a detector and integrator 58, and a Schmitt trigger 59. A bandpass filter 57 is used to filter out the dead-band portion of the error voltage. The bandpass filter 57 is of reasonably low Q centered at around 1000 Hz. The output signal from the filter 57 is then detected and integrated by the detector and integrator 58. The output of the detector and integrator 58 is applied to the Schmitt trigger or comparator 59 which then provides a digital output signal that is a logical zero indicating the presence of data when the output of the detector and integrator is below a predetermined threshold level. The DOS circuitry 71 can be made from conventional circuitry by one skilled in the art.

The DOS output signal indicates the presence of valid data to the microcomputer 64 of the modem (see FIG. 5). The reliability of the data communication system is enhanced since the DOS circuitry substantially reduces the probability of falsing due to noise, voice, music, or other interfering signals.

FIGS. 10 and 11 illustrate flow charts of sub-programs of the modem stored program for receiving and transmitting digital messages, respectively. The flow charts of FIGS. 10 and 11 represent the logical sequences of operations that must be performed in order to receive and transmit digital messages, respectively. The flow charts of FIGS. 10 and 11 are explicit descriptions of the microcomputer algorithms necessary to achieve the desired function. By referring to the flow charts of FIGS. 10 and 11, one of ordinary skill in the programming art may code the appropriate combination of instructions for a particular microcomputer to satisfy the operations called for in each block of the respective flow charts. The coding of the flow charts of FIGS. 10 and 11 may be accomplished in any suitable manner using the instructions of the particular microcomputer, for example, such as the instructions of the MC6801. The operations and processes specified in each block of the flow charts of FIGS. 10 and 11 are further supplemented in the foregoing description.

The foregoing embodiments have been intended as illustrations of the principles of the present invention.

Accordingly, other modifications, uses and embodiments can be devised by those skilled in the art without departing from the spirit and scope of the principles of the present invention.

What is claimed is:

1. A detector for a predeterminedly coded data signal predeterminedly transmitted in a serial bit stream by a clock signal, comprising:
    means for recovering the clock signal from the coded data signal;
    means for multiplying the coded data signal and the recovered clock signal and providing a multiplied output signal;
    bandpass filter means for passing spectral components of the multiplied output signal between a predetermined lower and upper frequency; and
    output means for providing an indication of the presence of the coded data signal when the magnitude of the output of the bandpass filter is less than a predetermined magnitude.

2. The detector according to claim 1, wherein said recovering means is a phase locked loop having in a forward path, a phase comparator, a loop filter, and a voltage controlled oscillator, and in a feedback path, a divider coupled between the voltage controlled oscillator and the phase comparator; said multiplying means is the phase comparator of the phase locked loop; and the loop filter is coupled to the bandpass filter means for providing the multiplied output signal thereto.

3. The detector according to claim 1, wherein the coded data signal is coded according to frequency-shift keying.

4. The detector according to claim 1, wherein said output means is a Schmitt trigger.

5. The detector according to claim 1, wherein the coded data signal is coded according to phase-shift keying.

6. The detector according to claim 3, wherein the frequency-shift keying of the coded data signal is performed such that binary bits having a predetermined first logical state are coded at the clock signal frequency and binary bits having a predetermined second logical state are coded at a predetermined multiple of the clock signal frequency.

7. A detector for a predeterminedly coded data signal predeterminedly transmitted in a serial bit stream by a clock signal, comprising:
    (a) phase-locked loop means including:
        (i) phase comparator means for multiplying the coded data signal and a feedback signal to provide a multiplied output signal;
        (ii) loop filter means for predeterminedly filtering the multiplied output signal to provide an error voltage signal;
        (iii) voltage-controlled oscillator (VCO) means responsive to the error voltage signal for providing a VCO output signal at a predetermined multiple of the clock signal; and
        (iv) dividing means for dividing the VCO output signal by the predetermined multiple to provide the feedback signal; and
    (b) bandpass filter means having a passband between predetermined lower and upper frequencies for filtering the error voltage signal and providing a filtered output signal; and
    (c) output means for providing an indication that the coded data signal is present when the magnitude of the filtered output signal is less than a predetermined magnitude.

8. The detector according to claim 7, wherein said output means is a Schmitt trigger.

9. The detector according to claim 7, wherein the coded data signal is coded according to frequency-shift keying.

10. The detector according to claim 7, wherein the coded data signal is coded according to phase-shift keying.

11. The detector according to claim 9, wherein the frequency-shift keying of the coded data signal is performed such that binary bits having a predetermined first logical state are coded at the clock signal frequency and binary bits having a predetermined second logical state are coded at a predetermined multiple of the clock signal frequency.

* * * * *